United States Patent
Lee et al.

(10) Patent No.: US 10,490,744 B2
(45) Date of Patent: Nov. 26, 2019

(54) CONTACT HOLE STRUCTURE METHOD FOR FABRICATING THE SAME AND APPLICATIONS THEREOF

(71) Applicant: MACRONIX INTERNATIONAL CO., LTD., Hsinchu (TW)

(72) Inventors: Dai-Ying Lee, Hsinchu County (TW); Po-Hao Tseng, Taichung (TW); Feng-Min Lee, Hsinchu (TW); Yu-Yu Lin, New Taipei (TW); Kai-Chieh Hsu, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/805,209

(22) Filed: Nov. 7, 2017

(65) Prior Publication Data
US 2019/0140172 A1    May 9, 2019

(51) Int. Cl.
*H01L 47/00* (2006.01)
*H01L 45/00* (2006.01)
*H01L 27/24* (2006.01)

(52) U.S. Cl.
CPC ...... *H01L 45/1253* (2013.01); *H01L 27/2436* (2013.01); *H01L 45/1233* (2013.01); *H01L 45/146* (2013.01)

(58) Field of Classification Search
CPC .......................... H01L 45/146; H01L 27/2436
See application file for complete search history.

(56) References Cited

U.S. PATENT DOCUMENTS

| | | | |
|---|---|---|---|
| 7,569,844 B2 | 8/2009 | Lung | |
| 7,884,343 B2 | 2/2011 | Lung et al. | |
| 8,084,760 B2 | 12/2011 | Lung et al. | |
| 2004/0228172 A1 | 11/2004 | Rinerson et al. | |
| 2006/0175599 A1* | 8/2006 | Happ | G11C 13/0004 257/4 |
| 2007/0158716 A1 | 7/2007 | Rinerson et al. | |
| 2007/0161186 A1* | 7/2007 | Ho | B82Y 10/00 438/257 |
| 2011/0026297 A1 | 2/2011 | Lin et al. | |

FOREIGN PATENT DOCUMENTS

CN            105990394 A         10/2016

OTHER PUBLICATIONS

TIPO Office Action dated Mar. 12, 2018 in Taiwan application (No. 106139069).

* cited by examiner

*Primary Examiner* — Samuel A Gebremariam
(74) *Attorney, Agent, or Firm* — McClure, Qualey & Rodack, LLP

(57) ABSTRACT

A contact hole structure includes a substrate, an interlayer dielectric (ILD), a conductive layer and an insulating capping layer. The ILD is disposed on the substrate and has a first opening. The conductive layer is disposed in the ILD and aligns the first opening. The insulating capping layer has a spacer disposed on a first sidewall of the first opening, wherein the spacer contacts to the conductive layer and defines a second opening in the first opening, so as to expose a portion of the conductive layer.

7 Claims, 8 Drawing Sheets

CONTACT HOLE STRUCTURE METHOD FOR FABRICATING THE SAME AND APPLICATIONS THEREOF

BACKGROUND OF THE INVENTION

Field of the Invention

The invention relates in general to an integrated circuits (IC), the method for fabricating the same and applications thereof, and more particularly to a contact hole structure, the method for fabricating the same and applications thereof.

Description of the Related Art

As IC become complex and the feature sizes continue to shrink, to form interconnection patterns exhibiting the requisite circuit speed with high dimensional accuracy and reliability. Interconnect technology is constantly challenged to satisfy the ever-increasing requirements for high density and performance associated with ultra-large-scale integration semiconductor devices. To form a contact hole is the critical process for the interconnect technology.

Therefore, there is a need of providing an advanced contact hole structure, the method for fabricating the same and applications to obviate the drawbacks encountered from the prior art.

SUMMARY OF THE INVENTION

According to one embodiment of the present disclosure, a contact hole structure is provided, wherein the contact hole structure includes a substrate, an interlayer dielectric (ILD), a conductive layer and an insulating capping layer. The ILD is disposed on the substrate and has a first opening. The conductive layer is disposed in the ILD and aligns the first opening. The insulating capping layer has a spacer disposed on a first sidewall of the first opening, wherein the spacer contacts to the conductive layer and defines a second opening in the first opening, so as to expose a portion of the conductive layer.

According to another embodiment of the present disclosure, a method for fabricating a contact hole structure is provided, wherein the method includes steps as follows: Firstly, a substrate is provided, and an ILD is then formed on the substrate. A conductive layer is formed in the ILD to make at least one portion of the conductive layer being exposed from a first opening of the ILD. Next, an insulating capping layer is formed to cover the ILD and extends into the first opening. A metal-containing buffer layer is formed to cover the insulating capping layer. After the portion of the metal-containing buffer layer disposed on the ILD is removed, a portion of the insulating capping layer disposed in the first opening is also removed to make the remaining insulating capping layer forming a spacer on a first sidewall of the first opening to contact to the conductive layer, so as to define a second opening in the first opening to expose a portion of the conductive layer.

According to yet another embodiment of the present disclosure, a resistance random access memory (ReRAM) element is provided, wherein the ReRAM element includes a substrate, an ILD, a bottom electrode layer, an insulating capping layer, a transition metal oxides (TMO) layer and a top electrode layer. The ILD is disposed on the substrate and has a first opening. The bottom electrode is disposed in the ILD and aligns the first opening. The insulating capping layer has a spacer disposed on a first sidewall of the first opening, wherein the spacer contacts to the conductive layer and defines a second opening in the first opening. The TMO layer is disposed in the second opening and contacts to the bottom electrode layer. The top electrode layer is disposed in the second opening and contacts to the TMO layer.

In accordance with the aforementioned embodiments of the present disclosure, a contact hole structure the method for fabricating the same and a ReRAM element applying the contact hole structure are disclosed. A conductive layer disposed in an ILD and exposed from a first opening of the ILD is firstly provided. An insulating capping layer is then formed to cover on the ILD and partially fill the first opening, and a metal-containing buffer layer is formed to cover the insulating capping layer. After the portion of the metal-containing buffer layer disposed on the ILD is removed, a portion of the metal-containing buffer layer is remained to cover the portion of the insulating capping layer that are disposed on a first sidewall of the first opening. Subsequently, the portion of the insulating capping layer disposed on a bottom of the first opening is removed to define a second opening in the first opening to expose at least one portion of the conductive layer.

By the protection of the portion of the metal-containing buffer layer, the portion of the insulating capping layer disposed on the first sidewall of the first opening can be prevented from being damaged by the etching process subsequently performed thereon. The scale of the second opening defined by the portion of the insulating capping layer can thus be precisely controlled, and the size of the semiconductor devices or interconnection structure formed in the second opening may be further shrank to improve the density of the IC applying the semiconductor devices or interconnection structure.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings.

FIG. 1E' is a cross-sectional view illustrating a contact hole structure, in accordance with another embodiment of the present disclosure;

FIG. 2E' is a cross-sectional view illustrating a contact hole structure, in accordance with yet another embodiment of the present disclosure;

DETAILED DESCRIPTION OF THE INVENTION

Figure 1A:
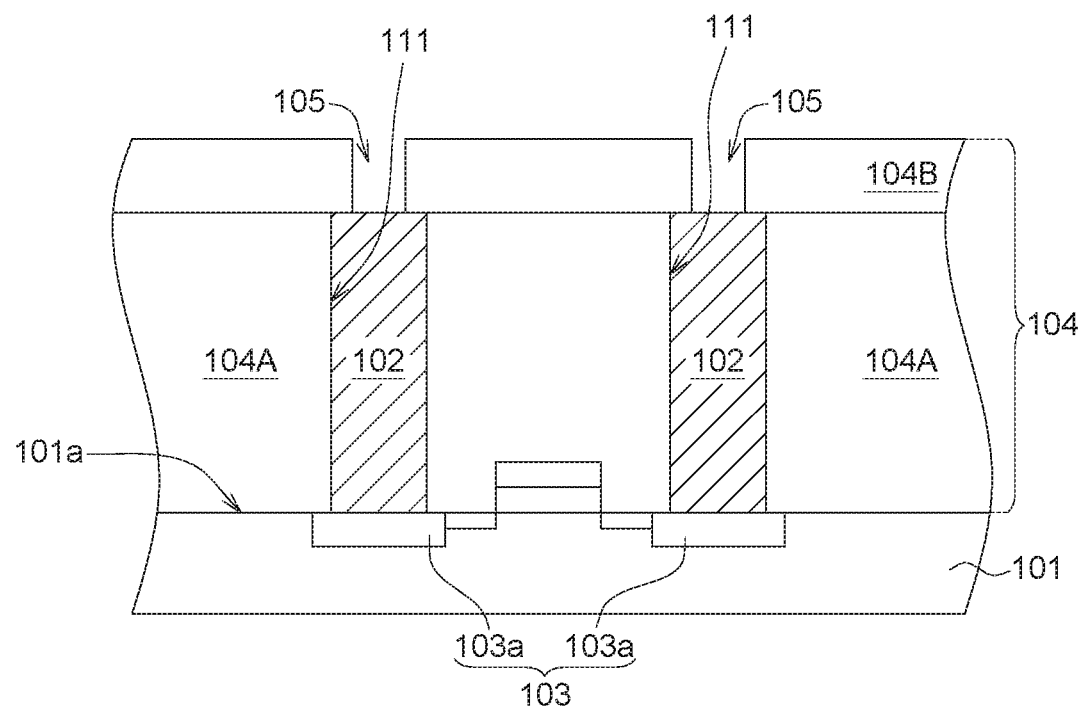
FIGS. 1A to 1E are cross-sectional views illustrating the processing structures for fabricating a contact hole structure, in accordance with one embodiment of the present disclosure.

A contact hole structure the method for fabricating the same and applications thereof are provided to shrink the size of the semiconductor devices or interconnection structure formed in the contact hole structure and improve the density of the IC applying the semiconductor devices or interconnection structure. A number of embodiments of the present disclosure are disclosed below with reference to accompanying drawings.

However, the structure and contents disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

FIGS. 1A to 1E are cross-sectional views illustrating the processing structures for fabricating a contact hole structure 100, in accordance with one embodiment of the present disclosure. The method for fabricating the contact hole structure 100 includes steps as follows: Firstly, a substrate 101 is provided, an ILD 104 is then formed on the substrate 101 and a conductive layer 102 is formed in the ILD 104 to make at least one portion of the conductive layer 102 being exposed from a first opening 105 of the ILD 104.

For example, the substrate 101 can be a silicon substrate, and a metal-oxide-semiconductor filled effect transistor (MOSFET) 103 can be formed in the silicon substrate. The ILD 104 includes a first ILD portion 104A stacked at the surface 101*a* of the substrate 101 and a second ILD portion 104B stacked at the first ILD portion 104A. The conductive layer 102 penetrates through the first ILD portion 104A and contacts the source/drain 103*a* of the MOSFET device 103 serving as a metal contact plug electrically connecting the MOSFET device 103 with another device (not shown). The second ILD portion 104B covers on the conductive layer 102 and has the first opening aligns the conductive layer 102, whereby at least one portion of the conductive layer 102 can be exposed from the first opening 105 (see FIG. 1A).

In some embodiments of the present embodiments, the material composing the first ILD portion 104A and the second ILD portion 104B may be at least one of silicon oxide (SiOx), silicon nitride (SiNx), silicon oxynitride (SiON) and other suitable material. The first ILD portion 104A and the second ILD portion 104B may be made of identical material or different materials. The conductive layer 102 may include metal.

In the present embodiment, the first ILD portion 104A can be firstly formed on the surface 101*a* of the substrate 101 by an atomic layer deposition (ALD). A through hole 111 passing through the first ILD portion 104A can be then formed by a reactive ion etching (RIE) process to expose a portion of the surface 101*a* of the substrate 101. Next, the through hole 111 is fulfilled with conductive material, and the conductive material is subjected to a planarization process, such as a chemical-mechanical polishing (CMP process), to form the conductively layer 102. Subsequently, the second ILD portion 104B is formed to cover the first ILD portion 104A and the conductively layer 102, and a portion of the second ILD portion 104B is removed to form the first opening 105 at least exposing one portion of the conductive layer 102. The first opening 105 has a width substantially ranging from 50 Å to 150 Å.

Figure 1B:
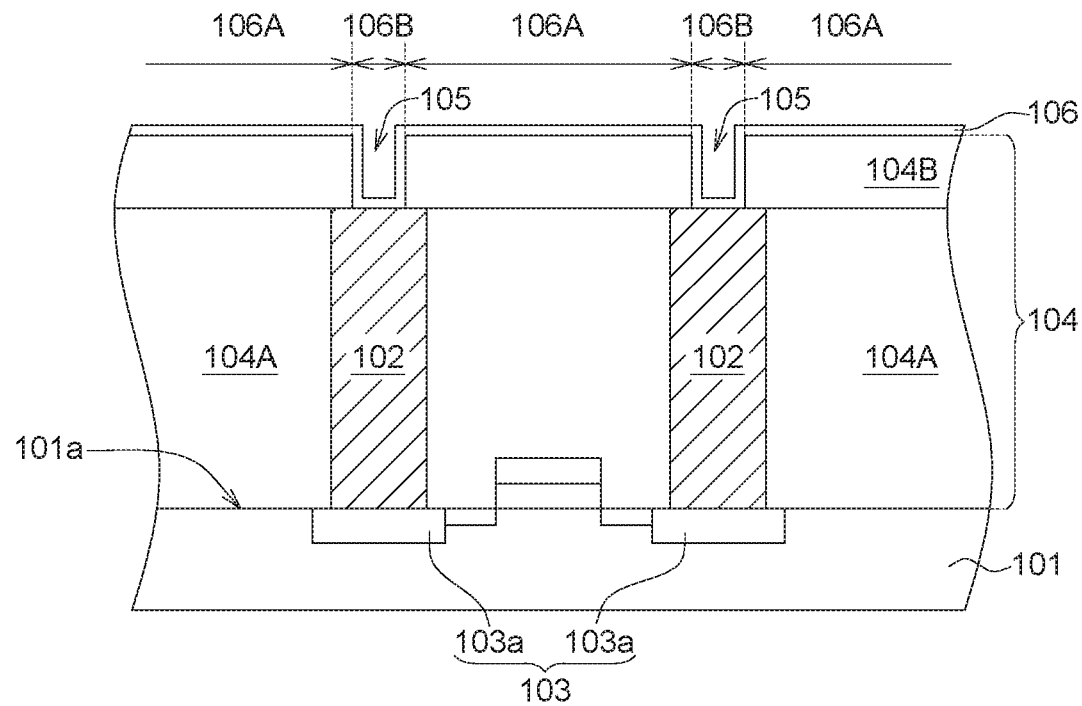

Next, an insulating capping layer 106 is formed on the ILD 104 and extends into the first opening 105 to cover the ILD 104 and the exposed portion of the conductive layer 102 (see FIG. 1B). In some embodiments of the present disclosure, the insulating capping layer 106 may be formed by SiOx, SiNx or the combination thereof. In the present embodiment, the insulating capping layer 106 can be a silicon oxide layer having a thickness ranging from 100 angstrom (Å) to 15000 Å formed on the ILD 104 and the conductive layer 102 by a deposition process (such as an ALD). The insulating capping layer 106 includes a first portion 106A covering on the second ILD portion 104B and a second portion 106B covering on the first sidewall 105*a* and the bottom 105*b* of the first opening 105. The insulating capping layer 106 is not fulfills the first opening 105.

Figure 1C:
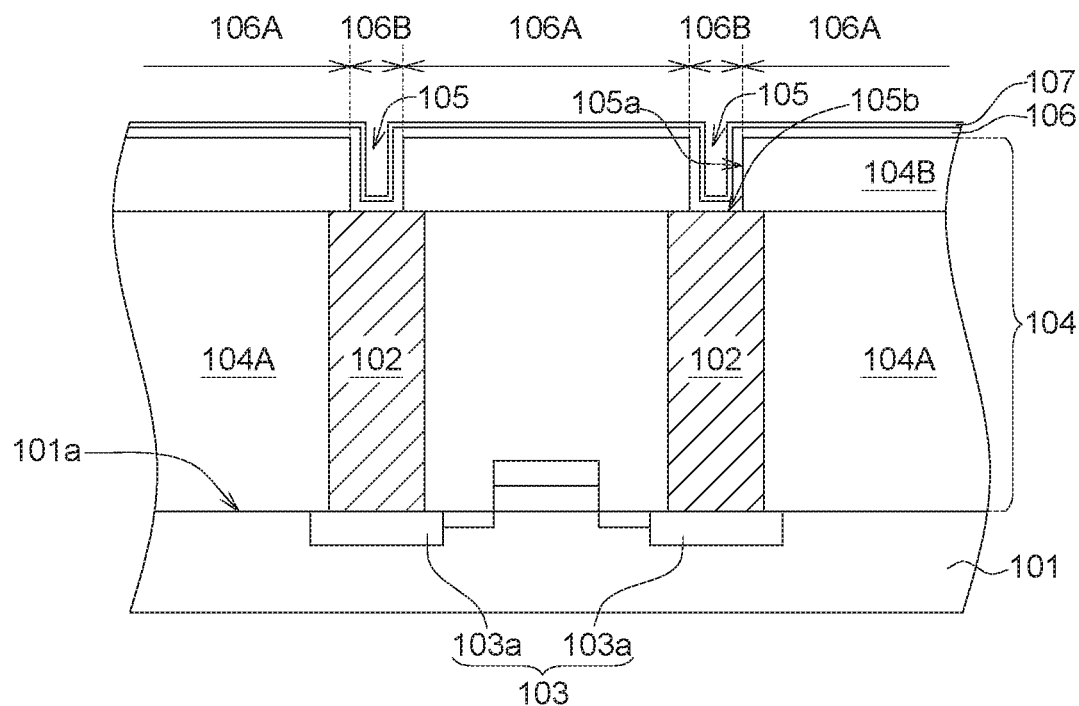
Figure 1D:
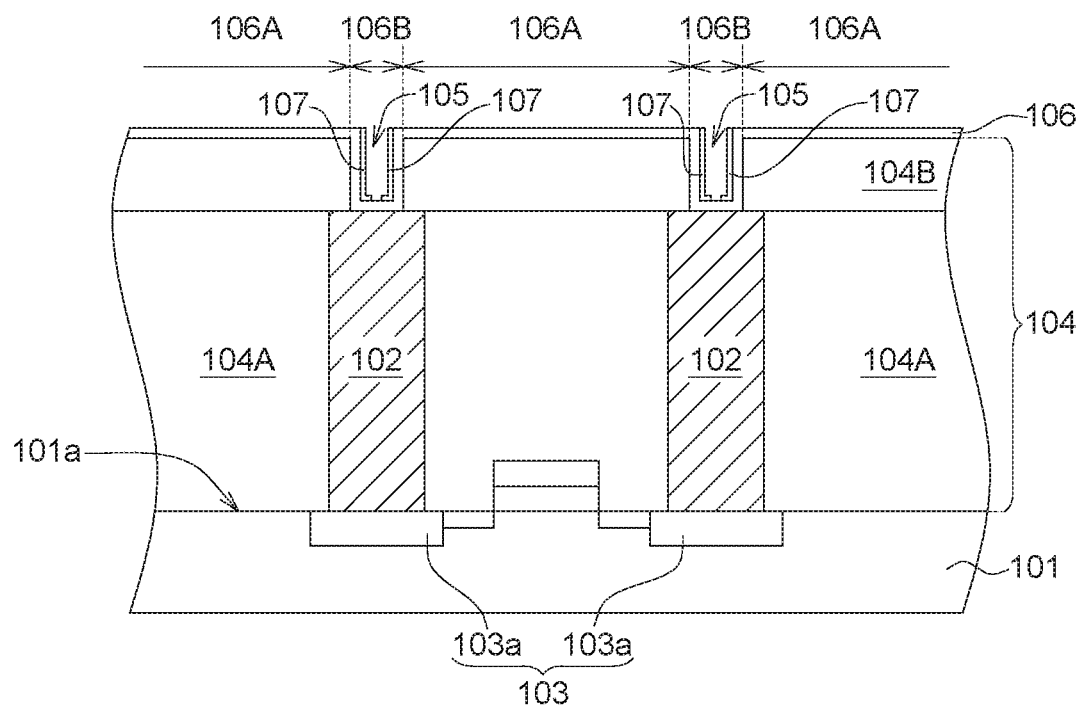

A metal-containing buffer layer 107 is then formed to cover the insulating capping layer 106 (see FIG. 1C). In some embodiments of the present disclosure, the material composing the metal-containing buffer layer 107 can be titanium (Ti), tantalum (Ta), titanium nitride (TiN), tantalum nitride (TaN) or the arbitrary combinations thereof. In the present embodiment, the metal-containing buffer layer 107 can be a TiN film having a thickness ranging from 10 angstrom (Å) to 200 Å formed by a deposition process (such as an ALD).

Subsequently, the portion of the metal-containing buffer layer 107 disposed on the first portion 106A of the insulating capping layer 106 (overlapping with the second ILD 104B) is removed. In some embodiments of the present disclosure, the portion of the metal-containing buffer layer 107 can be directly removed by a plasma etching process using the first portion 106A of the insulating capping layer 106 as a stop layer without any etching mask.

According to the nature of a deposition process, the portion of a deposition layer (such as the metal-containing buffer layer 107) formed in an opening (such as the first opening 105) may has a thickness substantially less than that of the portion of the deposition layer formed on a plane (such as the top surface of the first portion 106A of the insulating capping layer 106). Thus, while the portion of the metal-containing buffer layer 107 disposed on the first portion 106A of the insulating capping layer 106 is removed, in the present embodiment, the portion of the metal-containing buffer layer 107 disposed on the bottom 105*b* of the first opening 105 could be removed to expose a portion of the second portion 106B of the insulating capping layer 106; and merely a portion of the metal-containing buffer layer 107 is remained to partially cover the portion 106B of the second insulating capping layer 106 disposed on the first sidewall 105*a* of the first opening 105. Wherein the remaining portion of the metal-containing buffer layer 107 may have an L-shaped cross-sectional profile (see FIG. 1D). However, in some other embodiments, while the portion of the metal-containing buffer layer 107 disposed on the first portion 106A of the insulating capping layer 106 is removed, both portions of the metal-containing buffer layer 107 respectively disposed on the first sidewall 105*a* and the bottom 105*b* of the first opening 105 can be thoroughly removed.

Figure 1E:
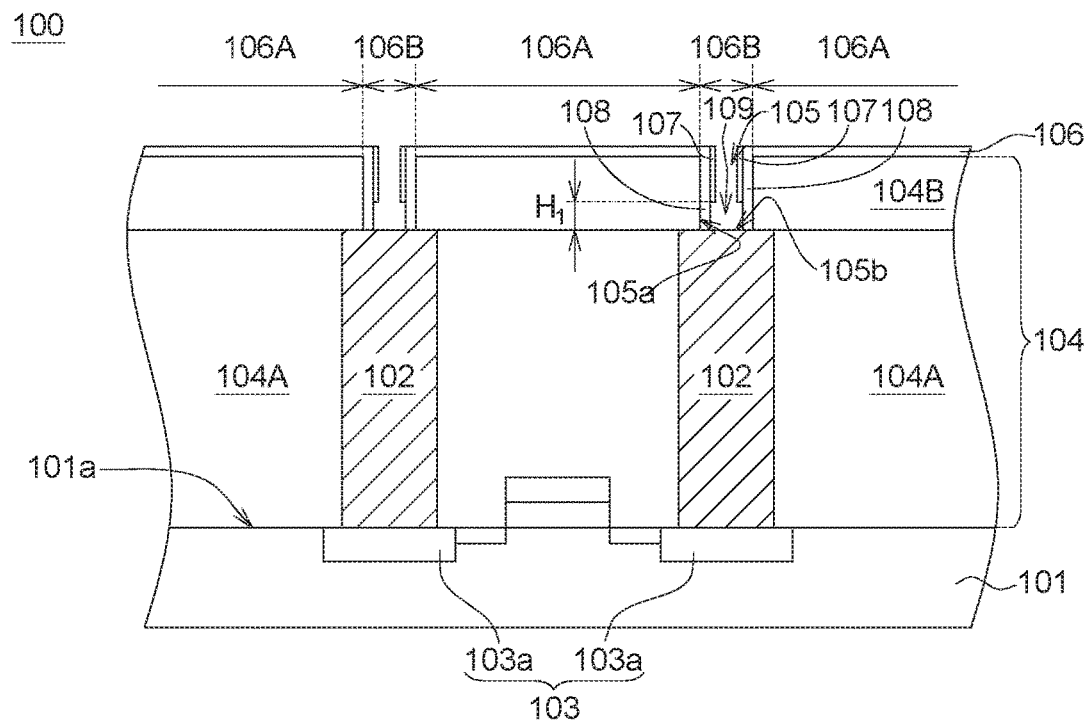
Figure 1E:
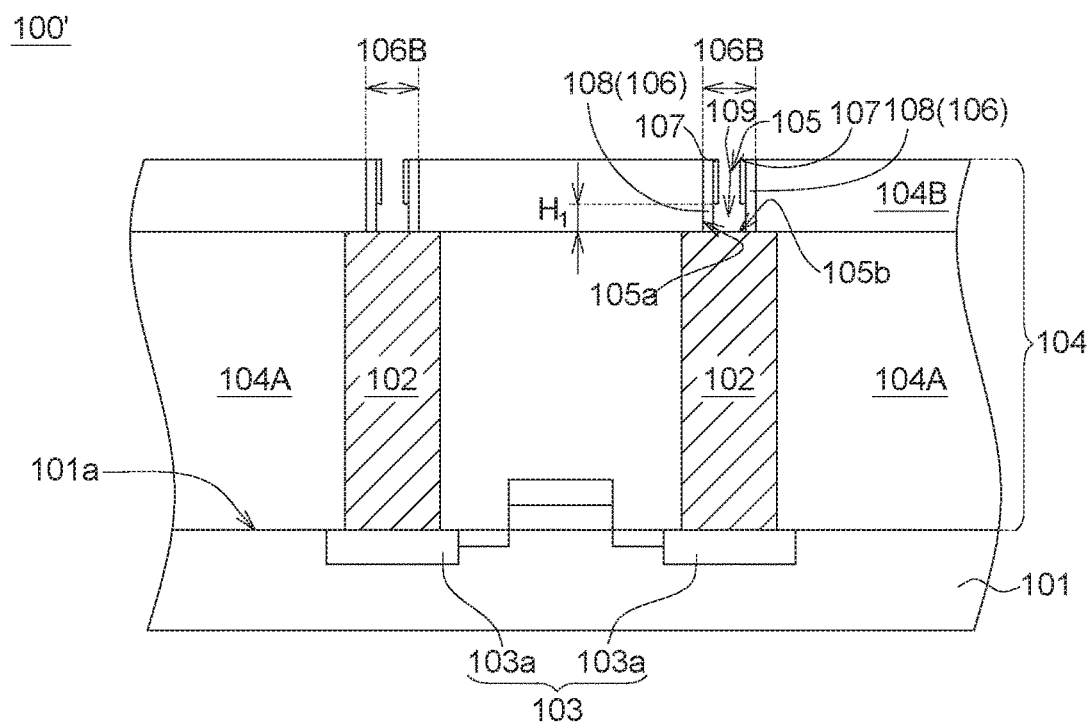

Thereafter, another etching process using the conductive layer 102 as a stop layer is performed to remove the portion of the second portion 106E of the insulating capping layer 106 disposed in the bottom 105b of the first opening 105, so as to make the remaining portion of the second portion 106E of the insulating capping layer 106 forming a spacer 108 on the first sidewall 105a of the first opening 105 to contact to the conductive layer 102 and to define a second opening 109 in the first opening 105 to expose a portion of the conductive layer 102. Meanwhile, the contact hole structure 100 as depicted in FIG. 1E is implemented. Wherein the remaining portion of the metal-containing buffer layer 107 is disposed on the spacer 108 and separates from the exposed portion of the conductive layer 102 for a distance H1.

In the present embodiment, after the second opening 109 is defined, the first portion 106A of the insulating capping layer 106 is not thoroughly removed by the etching process. The remained portion of the first portion 106A of the insulating capping layer 106 has a thickness substantially ranging from 10 Å to 300 Å. However, in some other embodiments of the present disclosure, the first portion 106A of the insulating capping layer 106 can be thoroughly removed by the etching process during the process for defining the second opening 109 of the contact hole structure 100'. In other words, the remained portion of the first portion 106A of the insulating capping layer 106 has a thickness about 0. Whereby the second ILD 104B can be exposed, and a step structure 110 can be formed by the second ILD 104B and the second portion 106B of the insulating capping layer 106 (see FIG. 1E'). Furthermore, in yet another embodiment, the etching process for defining the second opening 109 not only thoroughly removes the first portion 106A of the insulating capping layer 106 but also removes a portion of the second ILD 104B, whereby the thickness of the top of the second ILD 104B has a loss from 10 Å to 300 Å.

By the protection of the portion of the metal-containing buffer layer 107, the portion of the insulating capping layer 106 disposed on the first sidewall 105a of the first opening 105 and serving as the spacer 108 to define the second opening 109 can be prevented from being damaged by the etching process subsequently performed thereon. The scale of the second opening 109 can thus be precisely controlled, and the size of the semiconductor devices or interconnection structure formed in the second opening 109 may be further shrank to improve the density of the IC applying the semiconductor devices or interconnection structure.

FIGS. 2A to 2E are cross-sectional views illustrating the processing structures for fabricating a contact hole structure 200, in accordance with yet another embodiment of the present disclosure. The method for fabricating the contact hole structure 200 includes steps as follows: Firstly, a substrate 201 is provided, an ILD 204 is then formed on the substrate 201 and a conductive layer 202 is formed in the ILD 204 to make at least one portion of the conductive layer 202 being exposed from a first opening 205 of the ILD 204.

For example, the substrate 201 can be a silicon substrate, and a MOSFET 203 can be formed in the silicon substrate. The ILD 204 is stacked at the surface 201a of the substrate 201. The conductive layer 202 penetrates through the ILD portion 204 and contacts the source/drain 203a of the MOSFET device 203 serving as a metal contact plug electrically connecting the MOSFET device 203 with another device (not shown). The conductive layer 202 can be exposed from a first opening 205 formed in the ILD 204 (see FIG. 2A). In some embodiments of the present embodiments, the material composing the ILD 204 may be at least one of silicon oxide SiOx, SiNx, SiON and other suitable material. The conductive layer 202 may include metal.

In the present embodiment, the ILD 204 can be firstly formed on the surface 201a of the substrate 201 by an ALD. A through hole 211 passing through the ILD 204 can be then formed by a RIE process to expose a portion of the surface 201a of the substrate 201. Next, the through hole 211 is fulfilled with conductive material, and the conductive material is subjected to a planarization process, such as a CMP process, to form the conductively layer 202 extending downward into the substrate 201 from the surface 201a and contacting to the source/drain 203a of the MOSFET device 203.

Figure 2A:
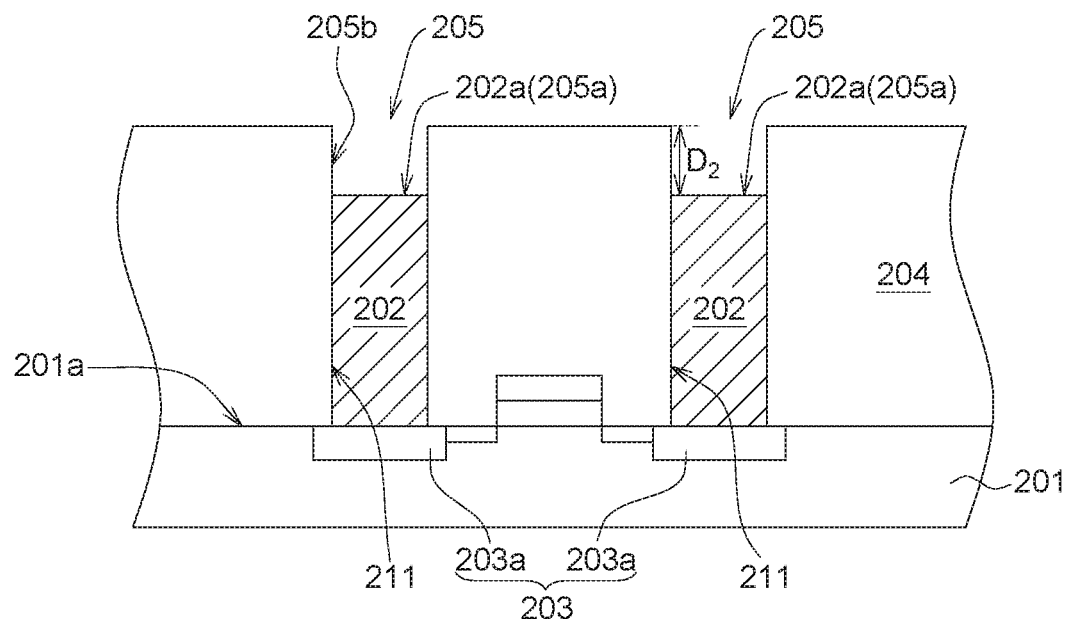
FIGS. 2A to 2E are cross-sectional views illustrating the processing structures for fabricating a contact hole structure, in accordance with yet another embodiment of the present disclosure.

Thereafter, an etch back process is performed to remove a portion of the conductively layer 202, so as to define the first opening 105, in which the top surface 202a of the conductive layer 203 is substantially lower than the surface 201a of the substrate 201 (see FIG. 2A). In some embodiments of the present disclosure, the first opening has a depth D2, measured form the surface 201a of the substrate 201 to the top surface 202a of the conductive layer 203, substantially ranging from 500 Å to 2000 Å. In the present embodiment, the depth D2 of the first opening 205 may range from 1000 Å to 1500 Å.

Figure 2B:
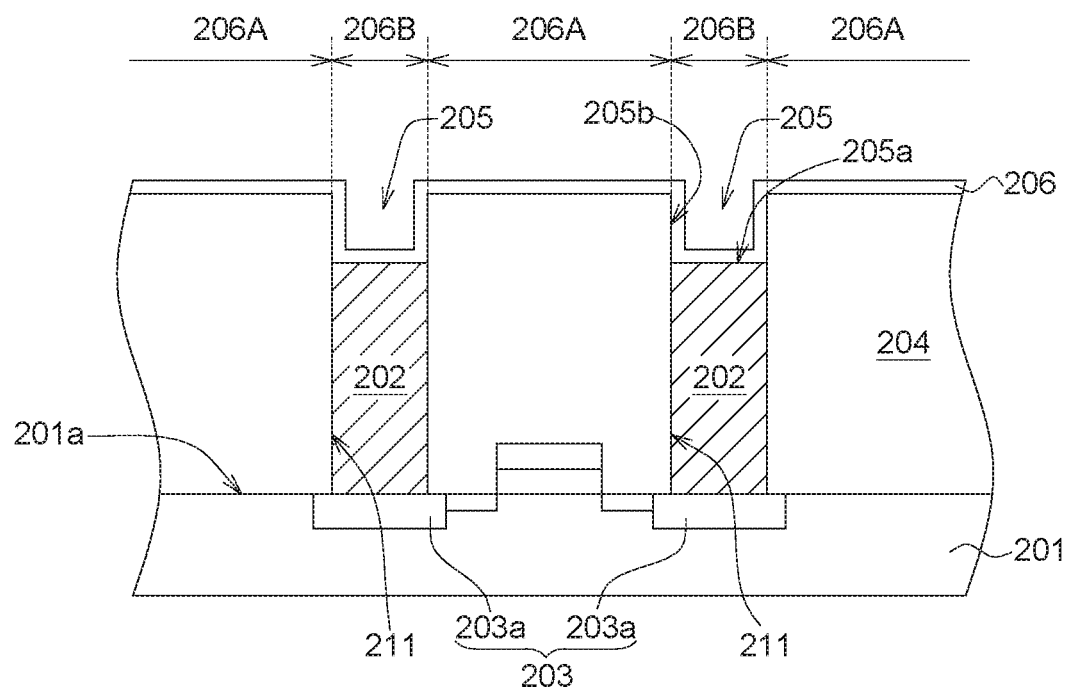
Figure 2C:
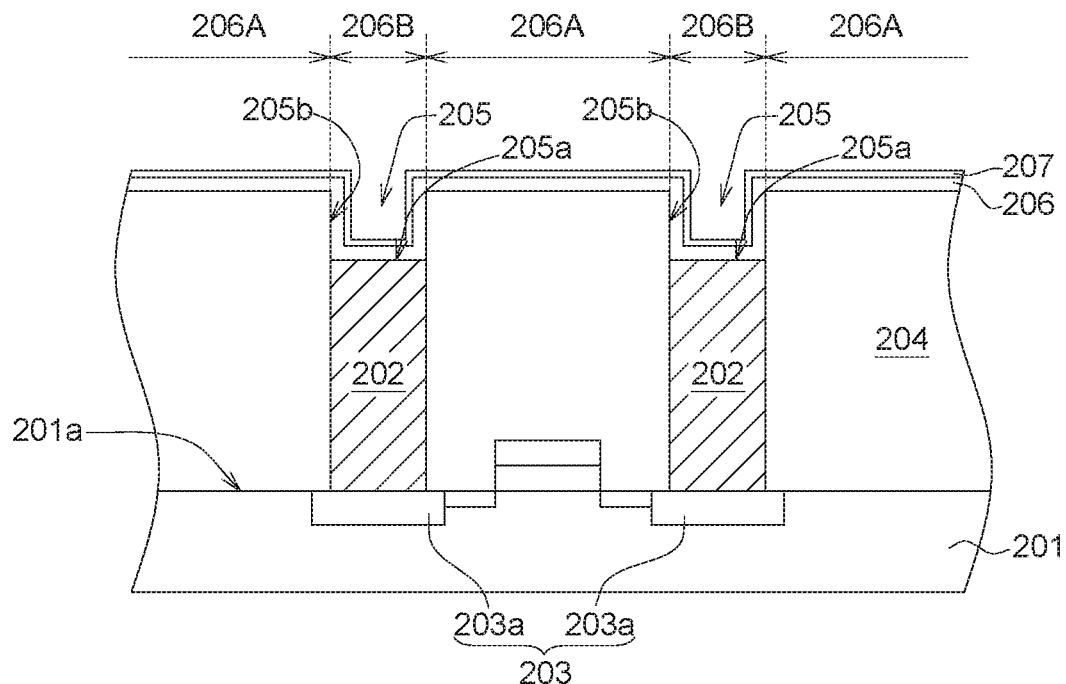
Figure 2D:
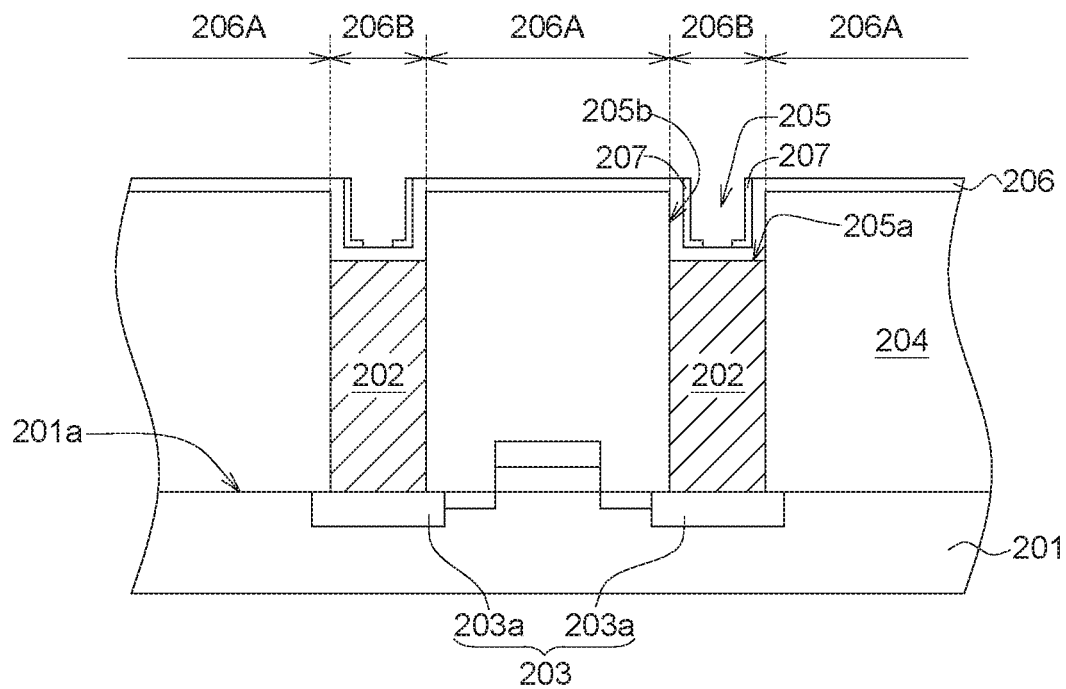

Next, an insulating capping layer 206 is formed on the ILD 204 and extends into the first opening 105 to cover the ILD 204 and the exposed portion of the conductive layer 102 (see FIG. 2B). In some embodiments of the present disclosure, the insulating capping layer 206 may be a silicon oxide layer having a thickness ranging from 100 Å to 2500 Å formed on the ILD 204 and the conductive layer 202 by a deposition process (such as an ALD). The insulating capping layer 206 includes a first portion 206A covering on the ILD 204 (not overlapping with the first opening 205) and a second portion 206B covering on the first sidewall 205a and the bottom 205b of the first opening 205 but not fulfilling the first opening 205.

A metal-containing buffer layer 207 is then formed to cover the insulating capping layer 206 (see FIG. 1C). In some embodiments of the present disclosure, the metal-containing buffer layer 207 can be a TiN film having a thickness ranging from 5 Å to 200 Å formed by a deposition process (such as an ALD). In the present embodiment, the thickness of the metal-containing buffer layer 207 may range from 10 Å to 100 Å.

Subsequently, the portion of the metal-containing buffer layer 207 disposed on the first portion 206A of the insulating capping layer 206 (overlapping with the ILD 204) is removed. In some embodiments of the present disclosure, the portion of the metal-containing buffer layer 207 can be directly removed by a plasma etching process using the first portion 206A of the insulating capping layer 206 as a stop layer without any etching mask.

According to the nature of a deposition process, the portion of a deposition layer (such as the metal-containing buffer layer 207) formed in an opening (such as the first opening 205) may has a thickness substantially less than that of the portion of the deposition layer formed on a plane (such as the top surface of the first portion 206A of the insulating capping layer 206). Thus, while the portion of the metal-containing buffer layer 207 disposed on the first portion 206A of the insulating capping layer 206 is removed, in the present embodiment, the portion of the metal-containing buffer layer 207 disposed on the bottom 205b of the first opening 205 could be removed to expose a portion of the second portion 206B of the insulating capping layer 206; and merely a portion of the metal-containing buffer layer 207 is remained to partially cover the portion 206B of the second insulating capping layer 206 disposed on the first sidewall 205a of the first opening 205. Wherein the remaining portion of the metal-containing buffer layer 207 may have an L-shaped cross-sectional profile (see FIG. 2D). However, in some other embodiments, while the portion of the metal-containing buffer layer 207 disposed on the first portion 206A of the insulating capping layer 206 is removed, both portions of the metal-containing buffer layer 207 respectively disposed on the first sidewall 205a and the bottom 205b of the first opening 205 can be thoroughly removed.

Figure 2E:
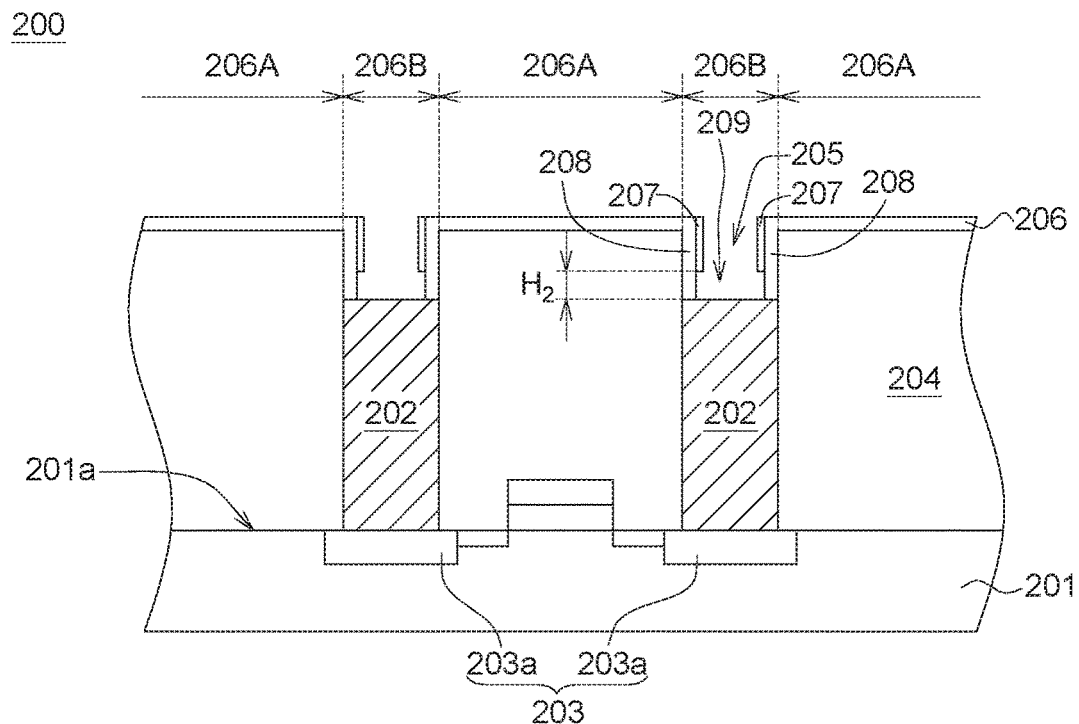
Figure 2E:
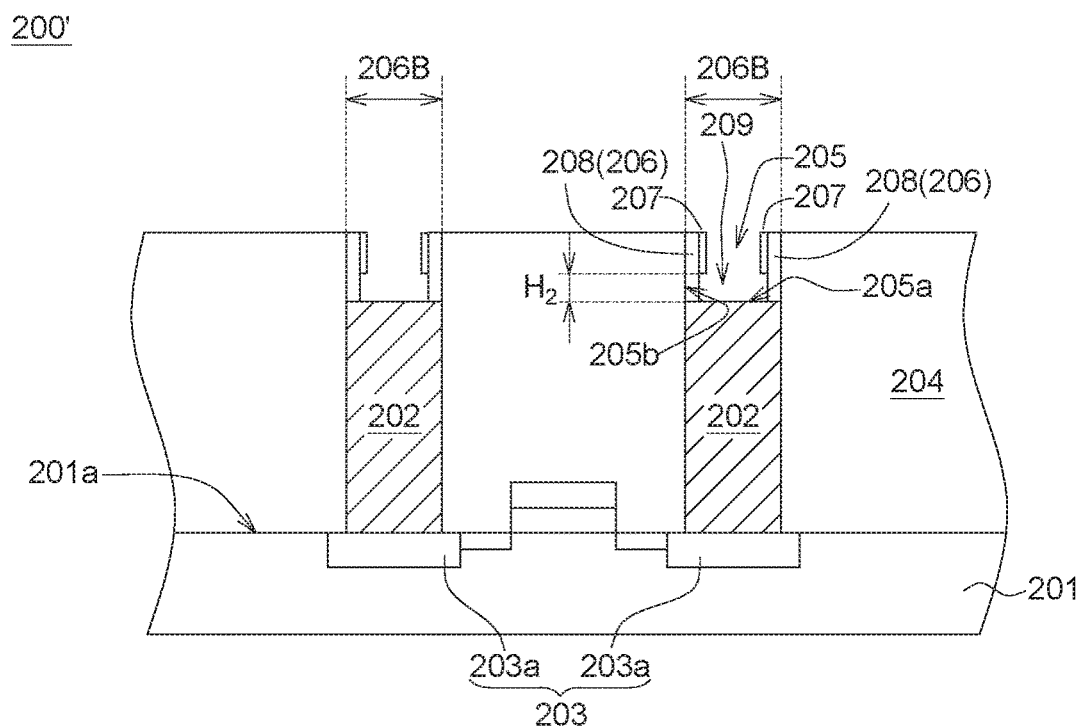

Thereafter, another etching process using the conductive layer 202 as a stop layer is performed to remove the portion of the second portion 206B of the insulating capping layer 206 disposed in the bottom 205b of the first opening 205, so as to make the remaining portion of the second portion 206B of the insulating capping layer 206 forming a spacer 208 on the first sidewall 205a of the first opening 205 to contact to the conductive layer 202 and to define a second opening 209 in the first opening 205 to expose a portion of the conductive layer 202. Meanwhile, the contact hole structure 200 as depicted in FIG. 2E is implemented. Wherein the remaining portion of the metal-containing buffer layer 207 is disposed on the spacer 208 and separates from the exposed portion of the conductive layer 202 for a distance H2.

In the present embodiment, after the second opening 209 is defined, the first portion 206A of the insulating capping layer 206 is not thoroughly removed by the etching process. The remained portion of the first portion 206A of the insulating capping layer 206 has a thickness substantially ranging from 50 Å to 1000 Å. However, in some other embodiments of the present disclosure, the first portion 206A of the insulating capping layer 206 can be thoroughly removed by the etching process during the process for defining the second opening 209 of the contact hole structure 200'. In other words, the remained portion of the first portion 206A of the insulating capping layer 206 has a thickness about 0. Whereby the second ILD 204B can be exposed (see FIG. 2E').

By the protection of the portion of the metal-containing buffer layer 207, the portion of the insulating capping layer 206 disposed on the first sidewall 205a of the first opening 205 and serving as the spacer 208 to define the second opening 209 can be prevented from being damaged by the etching process subsequently performed thereon. The scale of the second opening 209 can thus be precisely controlled, and the size of the semiconductor devices or interconnection structure formed in the second opening 209 may be further shrank to improve the density of the IC applying the semiconductor devices or interconnection structure.

Figure 3A:
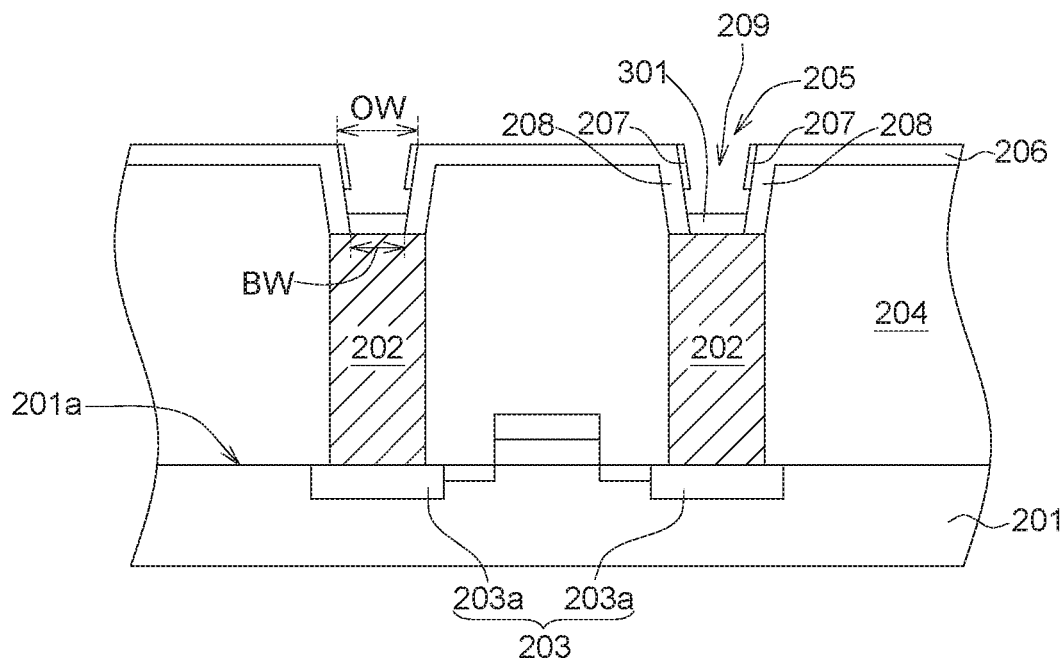
FIGS. 3A to 3C are cross-sectional views illustrating the processing structures for fabricating a ReRAM element applying the contact hole structure depicted in FIG. 2E.
Figure 3B:
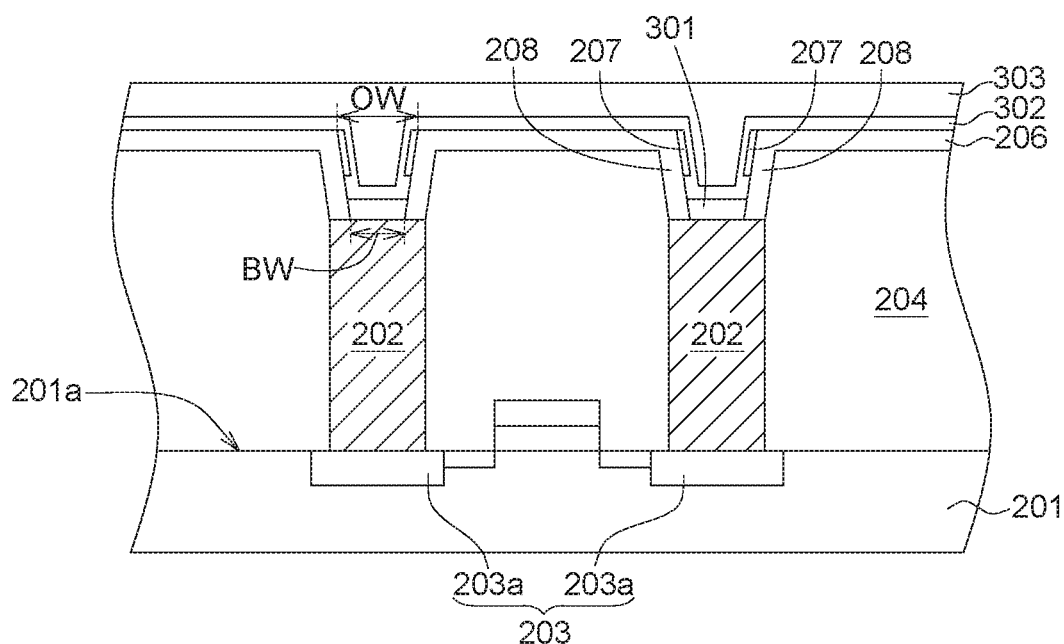
Figure 3C:
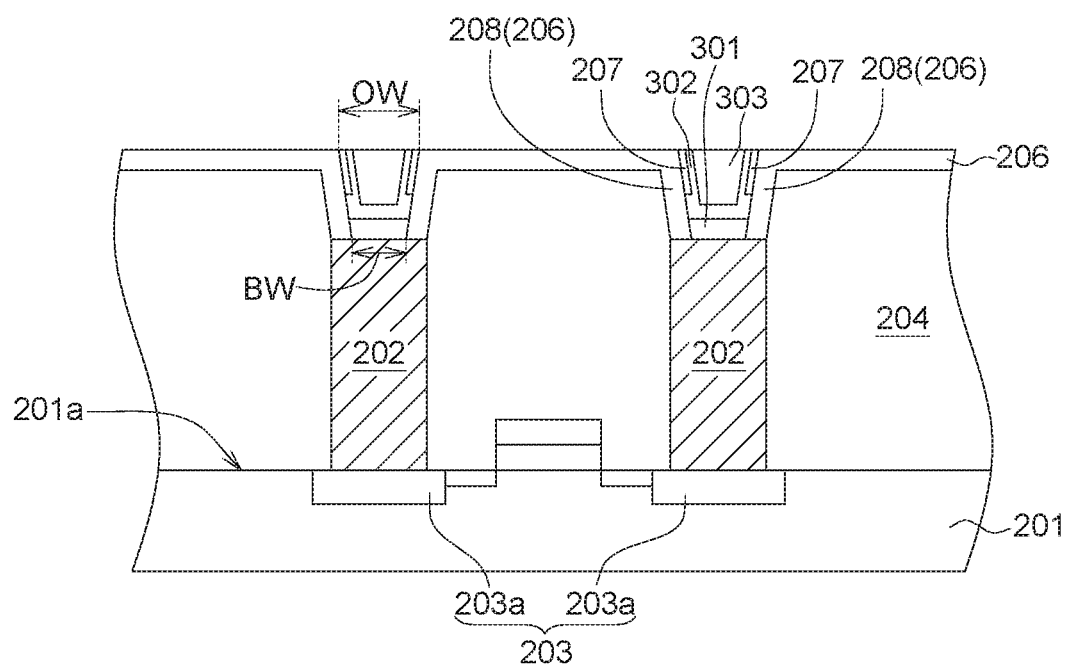

FIGS. 3A to 3C are cross-sectional views illustrating the processing structures for fabricating a ReRAM element 300 applying the contact hole structure 200 depicted in FIG. 2E. The method for fabricating the ReRAM element 300 includes steps as follows: A TMO layer 301 is firstly formed on the portion of the conductive layer 202 exposed from the second opening 209, so as to make the TMO layer 301 contacting with the conductive layer 202. In some embodiments of the present disclosure, the TMO layer 301 can be made of metal oxide, such as tantalum oxide (TaOx), tungsten oxide (WOx), hafnium oxide (HfOx) or the arbitrary combinations thereof. In the present embodiment, the TMO layer 301 may not fulfills the second opening 209 (see FIG. 3A).

Next, a top electrode layer 302 is formed to cover on the TMO layer 301, and a metal material layer 303 is formed on the top electrode layer 302 (see FIG. 3B). In the present embodiment, the top electrode layer 302 can be made of TaN, and the metal material layer 303 may include tungsten (W).

Thereafter, the metal material layer 303 and the top electrode layer 302 are subjected to a planarization process, such as a CMP process, using the first portion 206A of the insulating capping layer 206 as a stop layer, meanwhile the ReRAM element 300 as depicted in FIG. 3C is implemented. In the present embodiment, the conductive layer 202 of the contact hole structure 200 can serve as the bottom electrode layer of the ReRAM element 300.

As discussed above, the scale of the second opening 209 can thus be precisely controlled by the method for fabricating the contact hole structure 200. In the present embodiment, the second opening 209 may have a bottom width BW ranging from 5 nm to 50 nm and an open width OW ranging from 10 nm to 100 nm. The ReRAM element 300 formed in the second opening 209 can be shrank to at the size scale of the second opening 209. As a result, the memory density of the memory device applying the ReRAM element 300 can be significantly improved.

Figure 4:
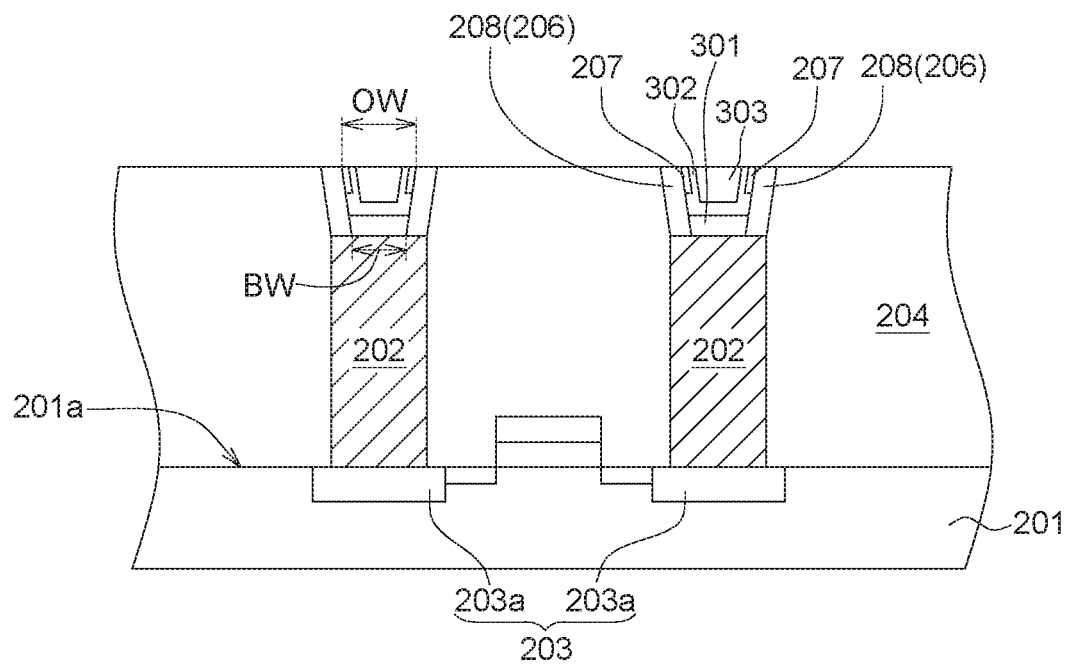
FIG. 4 is a cross-sectional view illustrating a ReRAM element applying the contact hole structure depicted in FIG. 2E'.

FIG. 4 is a cross-sectional view illustrating a ReRAM element 400 applying the contact hole structure 200' depicted in FIG. 2E'. The structure and the method for fabricating the ReRAM element 400 are similar to that of the ReRAM element 300, except that the ReRAM element 400 does not include the first portion 206A of the insulating capping layer 206. Such that the planarization process applied on the metal material layer 303 and the top electrode layer 302 may be performed by using the ILE 204 as a stop layer. Since the other identical steps for forming the ReRAM element 400 has been discussed above, thus it will not be redundantly described.

In accordance with the aforementioned embodiments of the present disclosure, a contact hole structure the method for fabricating the same and a ReRAM element applying the contact hole structure are disclosed. A conductive layer disposed in an ILD and exposed from a first opening of the ILD is firstly provided. An insulating capping layer is then formed to cover on the ILD and partially fill the first opening, and a metal-containing buffer layer is formed to cover the insulating capping layer. After the portion of the metal-containing buffer layer disposed on the ILD is removed, a portion of the metal-containing buffer layer is remained to cover the portion of the insulating capping layer that are disposed on a first sidewall of the first opening. Subsequently, the portion of the insulating capping layer disposed on a bottom of the first opening is removed to define a second opening in the first opening to expose at least one portion of the conductive layer.

By the protection of the portion of the metal-containing buffer layer, the portion of the insulating capping layer disposed on the first sidewall of the first opening can be prevented from being damaged by the etching process subsequently performed thereon. The scale of the second opening defined by the portion of the insulating capping layer can thus be precisely controlled, and the size of the semiconductor devices or interconnection structure formed in the second opening may be further shrank to improve the density of the IC applying the semiconductor devices or interconnection structure.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistance random access memory (ReRAM) element comprising:
   a substrate;
   an ILD, disposed on the substrate and having a first opening;
   a bottom electrode layer, disposed in the ILD and aligning the first opening;
   an insulating capping layer, disposed on the ILD and having a spacer disposed on a first sidewall of the first opening, and the spacer serving as a portion of the insulating capping layer, wherein the spacer contacts to the bottom electrode layer and defines a second opening in the first opening;
   a transition metal oxides (TMO) layer, disposed in the second opening and contacting to the bottom electrode layer; and
   a top electrode layer disposed in the second opening and contacting to the TMO layer.

2. The ReRAM element according to claim 1, further comprising a metal-containing buffer layer disposed on a second sidewall of the second opening, wherein the metal-containing buffer layer separates from the conductive layer for a distance.

3. The ReRAM element according to claim 2, wherein the metal-containing buffer layer comprises at least one of Ti, Ta, TiN and TaN.

4. The ReRAM element according to claim 1, wherein the insulating capping layer comprises:
   a first portion covering on the ILD; and
   a second portion extending into the first opening to form the spacer.

5. The ReRAM element according to claim 4, wherein the first portion has a thickness about 0, and a step structure is formed by the ILD and the second portion.

6. The ReRAM element according to claim 1, wherein the second opening has a bottom width ranging from 5 nm to 50 nm and an open width ranging from 10 nm to 100 nm.

7. The ReRAM element according to claim 1, further comprising a metal-oxide-semiconductor filled effect transistor (MOSFET) disposed in the substrate and having a source/drain contacting to the bottom electrode layer.

* * * * *